(12) United States Patent
Fischer et al.

(10) Patent No.: US 6,545,930 B2
(45) Date of Patent: Apr. 8, 2003

(54) INTEGRATED MEMORY HAVING A VOLTAGE REGULATING CIRCUIT

(75) Inventors: Helmut Fischer, Oberhaching (DE); Joachim Schnabel, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/008,793

(22) Filed: Nov. 13, 2001

(65) Prior Publication Data

US 2002/0060937 A1 May 23, 2002

(30) Foreign Application Priority Data

Nov. 10, 2000 (DE) .......................................... 100 55 920

(51) Int. Cl.$^7$ ................................................ G11C 8/00
(52) U.S. Cl. .................................... 365/226; 365/230.06
(58) Field of Search .............................. 365/226, 230.06

(56) References Cited

U.S. PATENT DOCUMENTS

| 5,553,021 A | 9/1996 | Kubono et al. ........ 365/185.33 |
| 5,568,424 A | 10/1996 | Cernea et al. ......... 365/185.33 |
| 6,016,281 A | 1/2000 | Brox ...................... 365/230.06 |
| 6,462,998 B1 * | 10/2002 | Proebsting .................. 365/205 |

* cited by examiner

Primary Examiner—M. Tran
(74) Attorney, Agent, or Firm—Laurence A. Greenberg; Werner H. Stemer; Gregory L. Mayback

(57) ABSTRACT

An integrated memory has a memory cell array with row lines and column lines. A row decoder for activating row lines is connected to address lines for transferring address signals. A voltage regulating circuit serves for applying a regulatable supply voltage to one of the row lines. For the purpose of setting the supply voltage, a driving circuit is connected to the address lines and to the voltage regulating circuit. This enables trimming of the voltage regulating circuit in conjunction with a comparatively small area requirement.

10 Claims, 3 Drawing Sheets

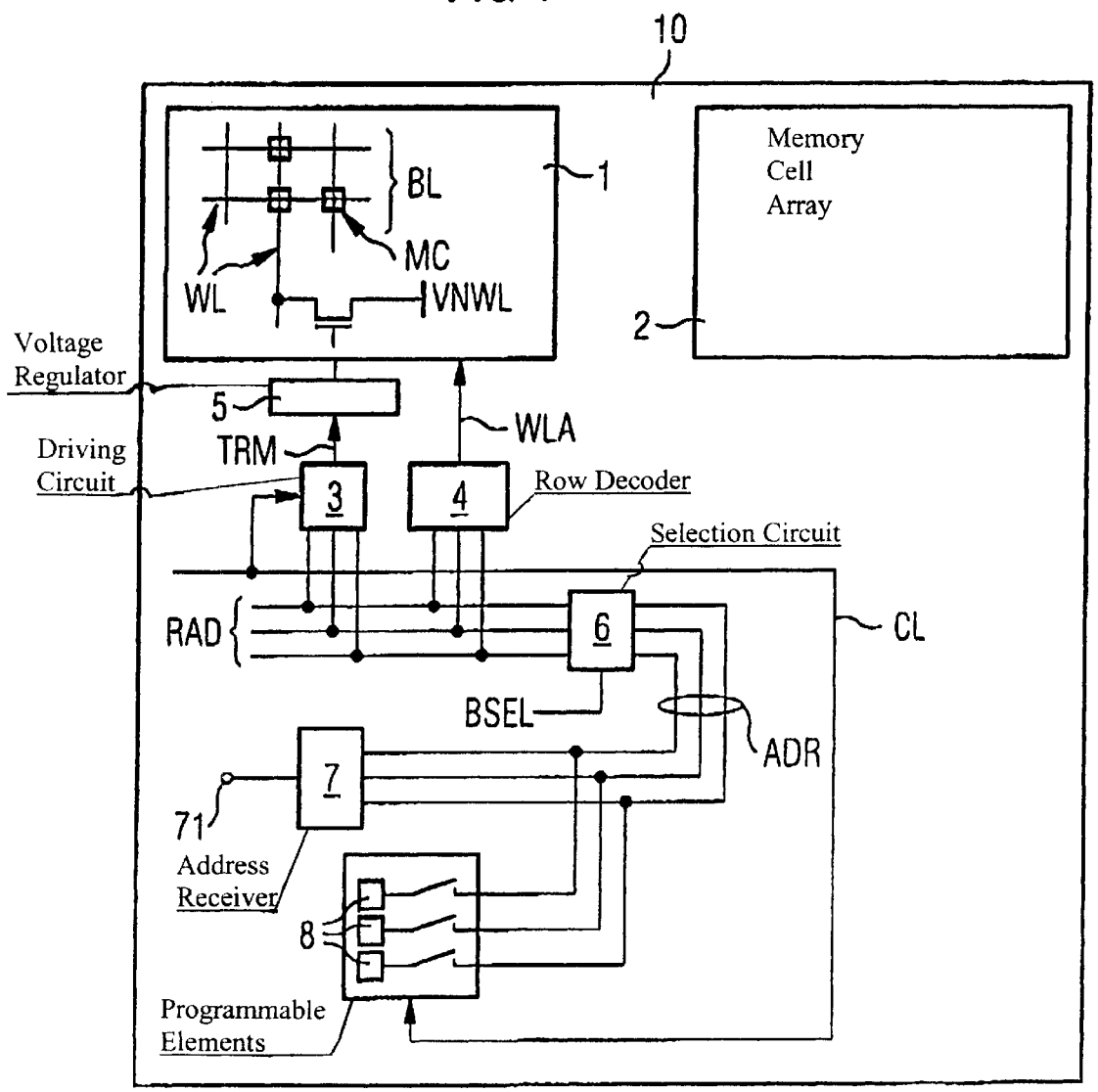

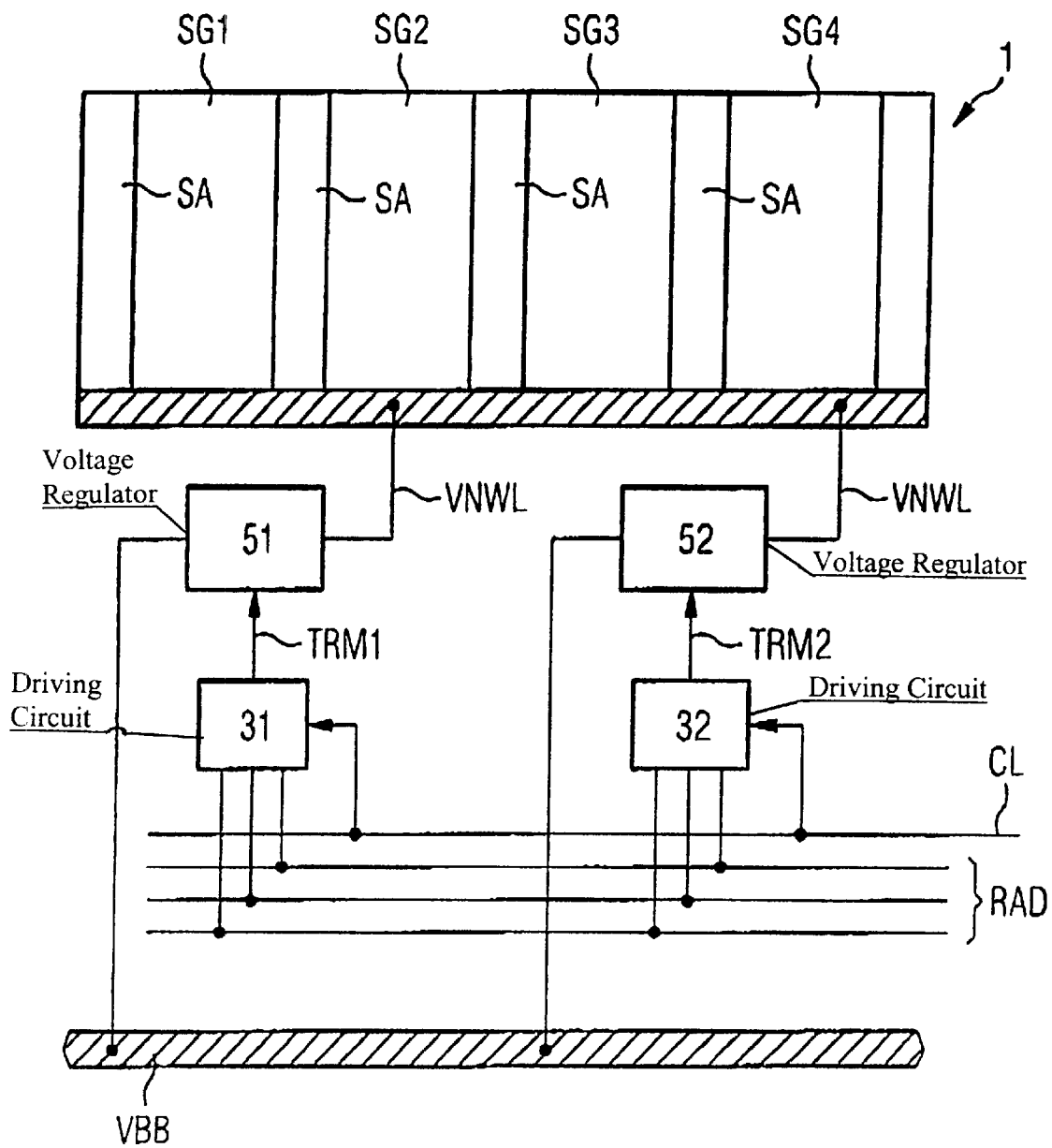

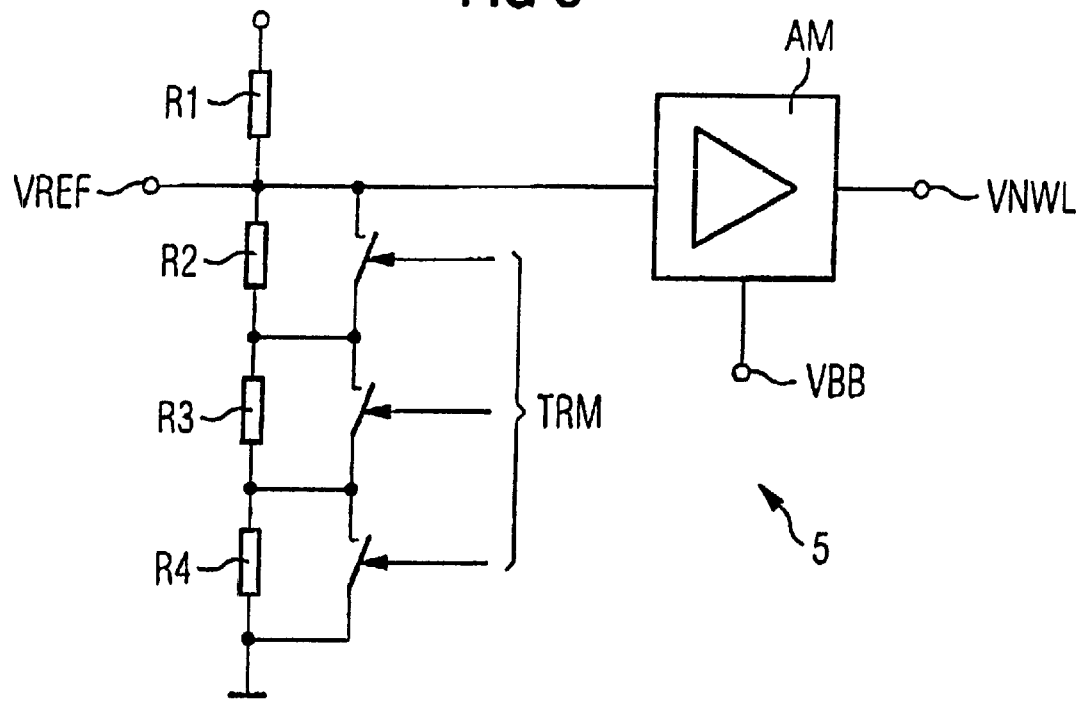
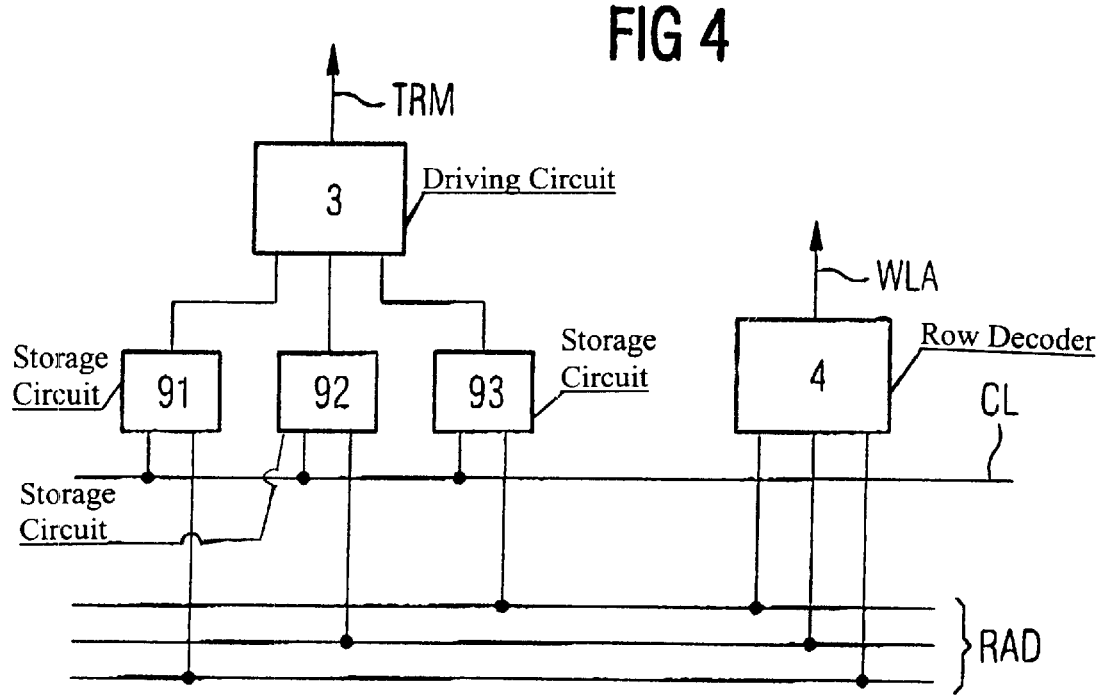

INTEGRATED MEMORY HAVING A VOLTAGE REGULATING CIRCUIT

BACKGROUND OF THE INVENTION

Field of the Invention

The present invention relates to an integrated memory having a memory cell array with row lines for selecting memory cells and column lines for reading out or writing data signals to/from the memory cells. The memory further has a voltage regulating circuit with a terminal for a regulatable supply voltage for application to one of the row lines.

An integrated memory generally has a memory cell array containing column lines and row lines. In this case, the memory cells are disposed at crossover points of the column lines and the row lines. The memory cells are each connected to one of the row lines. For the purpose of selection, by way of example, selection transistors of memory cells are turned on by an activated row line, as a result of which a data signal of a corresponding selected memory cell can subsequently be read out or written. To that end, the selected memory cell is connected via the selection transistor to one of the column lines, via which the corresponding data signal is read out or written in, respectively.

In an inactive state, the row lines are deactivated and, to that end, are precharged to a precharge potential for example. To that end, the respective row lines are applied to a corresponding supply voltage. In this case, it is advantageous in particular in memory cell arrays having comparatively small structural widths to generate the supply voltage from a so-called back-bias voltage of the cell array (voltage present across the substrate or across the well of the cell array) in such a way that this has a negative value relative to a reference-ground voltage of the memory without the back-bias voltage being altered. As a result, in particular, leakage currents of the selection transistors are effectively reduced even in the case of comparatively small structural widths.

In order to generate such a precharge voltage or supply voltage, a plurality of voltage regulating circuits are usually used for a respective memory bank, which generate from the back-bias voltage the respective required supply voltage which is applied to the row lines in the deactivated state. In order to be able to alter the target value for the precharge voltage at later times after the fabrication of the memory chip, the corresponding voltage regulating circuits are configured such that they are trimmable for the purpose of generating the precharge voltages. By feeding trimming signals to the respective voltage regulating circuit, it is possible for the corresponding precharge voltages to be adapted, for example on account of process fluctuations, to them and to be set accordingly. The trimmability requires the feeding of digital trimming signals for each voltage regulating circuit.

Since, in addition to address lines, generally a multiplicity of further lines are routed at the edge of a memory bank in the vicinity of the row decoder, in the region of which the precharge voltage is applied to the row lines for the purpose of deactivating the row lines, the provision of additional lines for trimming signals is associated with an additional space requirement on the memory chip.

SUMMARY OF THE INVENTION

It is accordingly an object of the invention to provide an integrated memory having a voltage regulating circuit that overcomes the above-mentioned disadvantages of the prior art devices of this general type, in which the trimming of the voltage regulating circuit is made possible in conjunction with a comparatively small area requirement.

With the foregoing and other objects in view there is provided, in accordance with the invention, an integrated memory. The memory contains a memory cell array having memory cells, row lines for selecting the memory cells, and column lines for reading out or writing data signals to/from the memory cells. A row decoder is connected to the memory cell array for activating the row lines. Address lines are connected to the row decoder, the address lines transferring address signals. A voltage regulating circuit is connected to the memory cell array and has a terminal for a regulatable supply voltage for application to one of the row lines. A driving circuit is provided for setting the regulatable supply voltage, and the driving circuit is connected to the address lines and to the voltage regulating circuit.

The transfer of trimming signals for the voltage regulating circuit via address lines that are connected to the row decoder enables the trimming of the voltage regulating circuit in conjunction with a comparatively small area requirement. During normal operation of the memory, the address lines serve for selecting row lines to be activated. The driving circuit is connected to the address lines for the purpose of setting the supply voltage. Since generally a relatively large number of address lines are disposed in the region of the row decoder, the address lines can be utilized for transferring signals to the driving circuit. Since the precharge voltage or supply voltage for deactivating the row lines is usually applied to the respective row lines in the region of the row decoders, the line routing of the address lines need not, moreover, be modified.

The trimming of the voltage regulating circuit is carried out for example during or after the initialization of the memory. To that end, the memory advantageously has programmable elements for instance in the form of programmable fuses which enable non-volatile storage of trimming signals. In order to carry out the trimming, the programmable elements are connected to the address lines by which the trimming signals are distributed over the memory chip and are transferred into corresponding driving circuits.

In an advantageous refinement of the invention, the memory has storage circuits that are connected between the address lines and the driving circuit. These serve for storing trimming signals that are transferred on the address lines. By the storage circuits, it is possible to carry out a so-called soft set for the driving circuit. The storage circuits contain, for example, bistable multivibrators that are set by the address lines.

In order to control the transfer of trimming signals between the storage circuits and the address lines, the memory preferably has a control line connected to the storage circuits. The control line enables the setting of the storage circuits by the address lines. The transfer of trimming signals via the address lines and also the subsequent storage of the trimming signals in storage circuits for transferring the signals into the driving circuit make it possible to limit the number of lines required for trimming to a single line in the region of the row decoder. This enables a comparatively small additional area requirement for line routing in the vicinity of the row decoder.

In a further advantageous development of the memory, the memory cell array is subdivided into individual series segments that are each isolated from one another by sense amplifiers. In this case, the series segments are disposed next to one another in the direction of the address lines. A plurality of the series segments are respectively assigned one of a plurality of driving circuits and one of a plurality of voltage regulating circuits. This results in a largely constant system that is insensitive to voltage drops. In particular, indirect influencing by the supply voltage applied to the deactivated row lines by instances of coupling-in is avoided. Since the individual series segments are disposed next to one another in the direction of the address lines, these can advantageously be used for transferring trimming signals without necessitating additional lines or a change to the line routing.

If the respective voltage regulating circuits of these series segments are additionally connected to a common line for the supply voltage, then voltage increases on account of comparatively high currents are avoided to a more extensive degree. The current loading along the common line is rendered uniform by a plurality of connected voltage regulating circuits.

In accordance with an added feature of the invention, the terminal for the regulatable supply voltage can be connected to the row lines for deactivating the row lines.

In accordance with an additional feature of the invention, the regulatable supply voltage is negative relative to a reference-ground voltage.

In accordance with a concomitant feature of the invention, the voltage regulating circuit has a terminal for receiving a reference voltage and a voltage divider circuit connected to the terminal for the reference voltage. The voltage divider has voltage divider elements that can be selectively connected in and disconnected by the driving circuit for setting the regulatable supply voltage.

Other features which are considered as characteristic for the invention are set forth in the appended claims.

Although the invention is illustrated and described herein as embodied in an integrated memory having a voltage regulating circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block circuit diagram of a first embodiment of an integrated memory according to the invention;

FIG. 2 is a block circuit diagram of a second embodiment of the integrated memory according to the invention;

FIG. 3 is a circuit diagram embodiment of a voltage regulating circuit; and

FIG. 4 is a block diagram of a third embodiment of the integrated memory according to the invention.

DESCRIPTION OF THE PREFERRED EMBODIMENTS

Referring now to the figures of the drawing in detail and first, particularly, to FIG. 1 thereof, there is shown an exemplary embodiment of an integrated memory 10 having a plurality of memory cell arrays 1, 2. In this case, for the sake of clarity, the illustration according to FIG. 1 illustrates only two of the memory cell arrays 1, 2. Each of the memory cell arrays 1, 2 has row lines WL and column lines BL. Memory cells MC are disposed at crossover points of the column lines BL and the row lines WL. The memory cells MC are respectively connected to one of the row lines WL and one of the column lines BL. They are selected via the respective row lines WL for a reading or writing operation. Via the column lines BL, a data signal is read from one of the memory cells MC or written to one of the memory cells MC.

The row lines WL are selected or activated via the row decoder 4 by a select signal WLA. For the purpose of deactivation, the corresponding row line WL is connected to a supply voltage VNWL via a switching device. In this case, the voltage VNWL is negative relative to a reference-ground voltage of the memory. What is achieved as a result is, in particular, that the selection transistors connected to the respective row lines turn off well in the deactivated state, resulting in the smallest possible loss of charge of the memory cells. The supply voltage VNWL is generated by the voltage regulating circuit 5, and is configured such that it is trimmable. A driving circuit 3 serves for setting the supply voltage VNWL and is connected to the voltage regulating circuit 5 for this purpose.

The row decoder 4 is connected to address lines RAD connected to a selection circuit 6. A bank select signal BSEL is connected to the selection circuit 6. Row addresses are applied to the address lines RAD via the selection circuit 6. These serve for the selection of one of the row lines WL via the row decoder 4. For its part, the selection circuit 6 is connected to address lines ADR connected to an address receiver 7. The latter has an address terminal 71, to which the memory addresses are applied by a controller for example.

The memory 10 additionally has programmable elements 8, in which trimming signals for trimming the voltage regulating circuit 5 can be stored in a nonvolatile fashion. Via respective switches, the programmable elements 8, for example in the form of laser fuses or electrically programmable fuses, can be connected to the address lines ADR and, by the selection circuit 6, to the address lines RAD. The trimming signals stored in the programmable elements 8 are output onto the address lines ADR for example during initialization of the memory and are transferred into the driving circuit 3, which is connected to the address lines RAD for this purpose. In this case, a control line CL serves for controlling the transfer of the trimming signals from the programmable elements 8 into the driving circuit 3. The setting of the supply voltage VNWL of the voltage regulating circuit 5 is performed by a drive signal TRM.

A further exemplary embodiment of the integrated memory according to the invention is shown in a more detailed illustration in FIG. 2. The memory cell array 1 is subdivided into individual series segments SG1 to SG4, which are each isolated from one another by a sense amplifier SA. The series segments SG1 to SG4 are disposed next to one another in the direction of the address lines RAD. The segments have a common voltage supply line for the supply voltage VNWL. Also provided is a supply line for a supply voltage VBB, from which the supply voltage VNWL is generated. In this case, the voltage VBB is a so-called back-biased voltage of the memory 10. Voltage regulating circuits 51 and 52 are each connected to the lines for the voltages VBB and VNWL, respectively.

The series segments SG2 and SG4 are each assigned a driving circuit 31 and the voltage regulating circuit 51 and, respectively, the driving circuit 32 and the voltage regulating circuit 52. The respective voltage VNWL is set by the respective drive signals TRM1 and TRM2. By virtue of the fact that the voltage regulating circuits 51 and 52 are connected to a common line for the supply voltage VNWL, a uniform current distribution is ensured in the case of the simultaneous deactivation of a plurality of row lines of the memory cell array 1. The use of the address lines RAD for transferring the trimming signals into the respective driving circuits 31 and 32 results in that, except for the control line CL, no further lines are necessary. Equally, there is no need to change the line routing. The row decoder is not illustrated in FIG. 2, for the sake of clarity.

FIG. 3 illustrates one embodiment of the voltage regulating circuit 5. The latter has a voltage divider circuit connected to a terminal for a reference voltage VREF. The voltage divider elements R1 to R4 are embodied in the form of resistors. The voltage divider elements R2 to R4 can be selectively connected in and disconnected by the drive signal TRM for the purpose of setting the supply voltage VNWL. The voltage divider circuit is connected to an amplifier AM, which generates the supply voltage VNWL from the supply voltage VBB.

FIG. 4 shows a third embodiment of the memory according to the invention. Storage circuits 91 to 93 for storing signals on the address lines RAD are connected between the address lines RAD and the driving circuit 3. The storage circuits 91 to 93 have, for example, bistable multivibrators (so-called flip-flops). The control line CL is connected to the storage circuits 91 to 93 and serves for controlling the transfer of signals between the storage circuits and the address lines. By use of the control line CL, the bistable multivibrators in the storage circuits 91 to 93 are set by the address lines RAD. In this way, it is possible to perform a so-called soft set of the trimming signals stored in the programmable elements 8 of FIG. 1. The driving signal TRM of the driving circuit 3 is set in a manner dependent on the signals stored in the storage circuits 91 to 93.

We claim:

1. An integrated memory, comprising:
   a memory cell array having memory cells, row lines for selecting said memory cells, and column lines for reading out or writing data signals to/from said memory cells;
   a row decoder connected to said memory cell array for activating said row lines;
   address lines connected to the row decoder, said address lines transferring address signals;
   a voltage regulating circuit connected to said memory cell array and having a terminal for a regulatable supply voltage for application to one of said row lines;
   a driving circuit for setting the regulatable supply voltage, said driving circuit connected to said address lines and to said voltage regulating circuit.

2. The integrated memory according to claim 1, including storage circuits connected between said address lines and said driving circuit, said storage circuit storing signals on said address lines.

3. The integrated memory according to claim 2, wherein said storage circuits each contain bistable multivibrators.

4. The integrated memory according to claim 2, including a control line connected to said storage circuits, said control line controlling a transfer of the signals between said storage circuits and said address lines.

5. The integrated memory according to claim 1, including programmable elements connected to said address lines for nonvolatile storage of signals for transfer into said driving circuit.

6. The integrated memory according to claim 1, wherein said terminal for the regulatable supply voltage can be connected to said row lines for deactivating said row lines.

7. The integrated memory according to claim 6, wherein the regulatable supply voltage is negative relative to a reference-ground voltage.

8. The integrated memory according to claim 1, wherein:
   said memory cell array has sense amplifiers and is subdivided into individual series segments isolated from one another by said sense amplifiers, said individual series segments are disposed next to one another in a direction of said address lines;
   said voltage regulating circuit is one of a plurality of voltage regulating circuits; and
   said driver circuit is one of a plurality of driver circuits each connected to one of said voltage regulating circuits, said individual series segments are respectively assigned to one of said plurality of driving circuits and one of said plurality of voltage regulating circuits.

9. The integrated memory according to claim 8, including a common line for the regulatable supply voltage, and said voltage regulating circuits are connected to said common line.

10. The integrated memory according to claim 1, wherein said voltage regulating circuit has a terminal for receiving a reference voltage and a voltage divider circuit connected to said terminal for the reference voltage, said voltage divider having voltage divider elements that can be selectively connected in and disconnected by said driving circuit for setting the regulatable supply voltage.

* * * * *